(12) United States Patent
Zelechowski et al.

(10) Patent No.: US 10,297,431 B2
(45) Date of Patent: May 21, 2019

(54) TREATING ARCS IN A PLASMA PROCESS

(71) Applicant: TRUMPF Huettinger Sp. z o. o., Zielonka (PL)

(72) Inventors: Marcin Zelechowski, Warsaw (PL); Piotr Lach, Wolomin (PL)

(73) Assignee: TRUMPF Huettinger Sp. z o. o., Zielonka (PL)

( * ) Notice: Subject to any disclaimer, the term of this patent is extended or adjusted under 35 U.S.C. 154(b) by 0 days.

(21) Appl. No.: 15/668,621

(22) Filed: Aug. 3, 2017

(65) Prior Publication Data

US 2017/0330737 A1 Nov. 16, 2017

Related U.S. Application Data

(63) Continuation of application No. PCT/EP2016/051532, filed on Jan. 26, 2016.

(30) Foreign Application Priority Data

Feb. 3, 2015 (EP) ..................................... 15461509

(51) Int. Cl.
*G01R 31/12* (2006.01)
*H01J 37/24* (2006.01)
*H01J 37/32* (2006.01)
*H01J 37/34* (2006.01)
*H01J 37/244* (2006.01)

(52) U.S. Cl.
CPC ...... *H01J 37/3476* (2013.01); *G01R 31/1254* (2013.01); *H01J 37/241* (2013.01); *H01J 37/244* (2013.01); *H01J 37/32944* (2013.01); *H01J 37/3444* (2013.01);

(Continued)

(58) Field of Classification Search
USPC ........................................ 315/111.21, 111.51
See application file for complete search history.

(56) References Cited

U.S. PATENT DOCUMENTS 7,366,622 B1 * 4/2008 Nemir ................ G01R 31/1272
361/2
7,995,313 B2 8/2011 Nitschke
(Continued)

FOREIGN PATENT DOCUMENTS

CN 101772992 A 7/2010
CN 103069928 A 4/2013
(Continued)

OTHER PUBLICATIONS

Notification of Transmittal of the International Search Report and the Written Opinion of the International Searching Authority for PCT Application No. PCT/EP2016/051532, dated Mar. 8, 2016, 14 pages.

(Continued)

*Primary Examiner* — Dion Ferguson
*Assistant Examiner* — Srinivas Sathiraju
(74) *Attorney, Agent, or Firm* — Fish & Richardson P.C.

(57) ABSTRACT

An arc treatment device includes an arc detector operable to detect whether an arc is present in a plasma chamber, an arc energy determiner operable to determine an arc energy value based on an energy supplied to the plasma chamber while the arc is present in the plasma chamber, and a break time determiner operable to determine a break time based on the determined arc energy value.

20 Claims, 3 Drawing Sheets

(52) U.S. Cl.
CPC .............. *H01J 2237/0206* (2013.01); *H01J 2237/24564* (2013.01); *H01J 2237/3322* (2013.01)

(56) References Cited

U.S. PATENT DOCUMENTS

| | | | |
|---|---|---|---|
| 9,263,241 B2* | 2/2016 | Larson | H01J 37/32944 |
| 9,818,579 B2* | 11/2017 | Ozimek | H01J 37/32064 |
| 2007/0251813 A1* | 11/2007 | Ilic | C23C 14/34 |
| | | | 204/192.1 |
| 2008/0218923 A1* | 9/2008 | Wiedemuth | H01J 37/32935 |
| | | | 361/94 |
| 2009/0308734 A1 | 12/2009 | Krauss | |
| 2012/0205243 A1 | 8/2012 | Matsubara et al. | |
| 2012/0285620 A1* | 11/2012 | Larson | H01J 37/32944 |
| | | | 156/345.28 |
| 2015/0287576 A1* | 10/2015 | Grede | H01J 37/32944 |
| | | | 315/111.21 |
| 2016/0141155 A1* | 5/2016 | Larson | H01J 37/32944 |
| | | | 315/111.21 |

FOREIGN PATENT DOCUMENTS

| | | |
|---|---|---|
| DE | 102009002684 B4 | 11/2010 |
| EP | 2026375 A2 | 2/2009 |
| EP | 1928009 B1 | 4/2013 |
| EP | 2790205 A1 | 10/2014 |
| JP | 2008-047292 | 2/2008 |
| JP | 2008-226839 | 9/2008 |
| JP | 2010-510633 | 4/2010 |
| JP | 2011-527379 | 10/2011 |
| KR | 101036211 B1 | 5/2011 |
| WO | WO 02/072912 | 9/2002 |
| WO | WO2005096344 A1 | 10/2005 |
| WO | WO2008100318 A1 | 8/2008 |
| WO | WO 2011/064958 | 6/2011 |
| WO | WO 2012/023276 | 2/2012 |

OTHER PUBLICATIONS

International Search Report for PCT Application No. PCT/EP2015/079863, dated Mar. 21, 2016, 3 pages.
Office Action in Japanese Application No. 2017-541035, dated Feb. 4, 2019, 8 pages (with English translation).

* cited by examiner

TREATING ARCS IN A PLASMA PROCESS

CROSS-REFERENCE TO RELATED APPLICATIONS

This application is a continuation of and claims priority under 35 U.S.C. § 120 to PCT Application No. PCT/EP2016/051532 filed on Jan. 26, 2016, which claims priority to European Application No. 15 461 509.0 filed on Feb. 3, 2015. The entire contents of these priority applications are incorporated herein by reference.

TECHNICAL FIELD

The invention relates to methods, devices, and systems for treating arcs occurring while a plasma process is being carried out in a plasma chamber.

BACKGROUND

The coating of substrates, e.g., glass, by cathode sputtering in plasma processes is well known. The sputtering can be done conventionally or using a reactive gas, which is called reactive sputtering. In the sputtering, a power supply produces a plasma, which removes material from a target, and the removed target material is then coated on a substrate, e.g., a glass substrate. If a reactive process is used, the target atoms can combine with gas atoms or molecules, depending on the desired coating.

In particular, if reactive processes are being used, arcs can occur in the plasma process. Such arcs can be detrimental to the plasma process and can even destroy the coating. Therefore, it is necessary to detect arcs quickly and reliably. Often, arcs are detected by monitoring an output voltage of the power supply. If there is a rapid fall in the output voltage, an arc is detected. Alternatively, the current can be monitored. If there is an instant rise in the output current, this is also indicative of an arc. In particular, each of the output current and the output voltage of the power supply can be monitored and compared with a respective threshold value.

Often, when an arc is detected, the power supply is turned off, so the arc is quenched. Turning off the power supply results in lower deposition rates. Therefore, the turn-off of the power should be as short as possible but as long as needed to avoid generation of another arc. In the following, the turn-off time before the power is switched on again is called a break time. For different processes and cathodes being used, different break times after arc detection are needed. It is known, to set break times by a user. However, it is difficult to set a proper break time. As mentioned before, the break time should be long enough for hot spots to cool down, so as to avoid new arc generation. On the other hand, the break time should be as short as possible to avoid unnecessary power losses during the plasma process.

SUMMARY

One object of the invention is to ensure reliable quenching of arcs but also high deposition rates.

One aspect of the invention features an arc treatment device including:

a) an arc detection device (or an arc detector) detecting an arc being present in a plasma chamber;

b) an arc energy determination device (or an arc energy determiner) for determining an arc energy value which is a value corresponding to an energy supplied to the plasma chamber while the arc is present in the plasma chamber;

c) a break time determination device (or a break time determiner) for determining a break time from the determined arc energy value.

Hence, according to the present invention, for each process an individual break time can be determined for each arc by determining an arc energy value.

The arc energy value may be the energy supplied to the plasma chamber while the arc is present in the plasma chamber. Alternatively, the arc energy value may be a calculated value based on the energy supplied to the plasma chamber while the arc is present in the plasma chamber. The calculated value may be the whole or a part of the energy supplied to the plasma chamber while the arc is present in the plasma chamber multiplied by a factor or decremented/incremented by a predetermined offset.

The arc energy value may be determined based on the energy supplied to the plasma chamber during a certain time interval. The time interval may as long as, longer, or shorter than the whole arc duration. Preferably, the occurrence of the arc lies in the time interval.

Examples are as follows:
the arc energy value may be the whole energy supplied to the plasma chamber while the arc is present if the energy is determined during a time interval between the start of the arc and extinction of the arc,
the arc energy value may be a portion of the energy supplied to the plasma chamber while the arc is present if the energy is determined during a time interval between
  the time points of detection of the arc and extinction of the arc, or
  the time points of reaction to the detection of the arc and the extinction of the arc,
  the time points of detection of the arc and the time point when the arc energy or arc current falls under a predetermined threshold,
  the time points of reaction to the detection of the arc and the time point when the arc energy or arc current falls under a predetermined threshold, or
  a similar time interval, or
the time interval may also start before a given time duration before the arc starts, or
the time interval may also end at after a given time duration after the arc extinction.

The break time determination device may be configured to calculate the break time based on the arc energy value. For each arc energy value, it can be determined how long a break time is needed for the arc to quench. Thus, the break time can be shorter compared to the break times set by a user, since a user has to set a break time, which is long enough to allow each arc to be quenched. Therefore, the set break times are far longer than actually needed, because the user has to choose the break time based on the longest arc expected or the arc with the highest energy expected. If an individual break time is calculated or determined for each arc that occurs, shorter break times can be realized, which lead to higher deposition rates. Thus, the yield can be improved.

The arc treatment device may have an input for receiving a signal related to a plasma process. For example, a current, voltage or a power can be input to the arc treatment device. However, there may also be provided an optical sensor at the plasma chamber which can be used for detecting arcs and such a sensor may deliver a signal to the input of the arc treatment device.

A data transfer arrangement may be provided for transferring an arc detection signal from the arc detection device to a power supply control (or a power supply controller). Hence, if the arc detection device detects an arc being present in the plasma chamber, a signal can be output to the power supply control, which can then shut off the power supply in response to receiving an arc detection signal. On the other hand, the power supply control may also receive a signal, for example from the arc treatment device, which allows the power supply to be turned on again after the break time has elapsed.

A further data transfer arrangement may be provided for transferring the arc energy value from the arc treatment device to the power supply control.

An additional data transfer arrangement may be provided for transferring the break time information from the arc treatment device to the power supply control.

The data transfer arrangement, the further data transfer arrangement and the additional data transfer arrangement may be three individual transfer arrangements or incorporated in two or in one single transfer arrangement.

The arc treatment device may be part of the power supply control.

Another aspect of the invention features a method of treating arcs occurring while a plasma process is being carried out in a plasma chamber, including the method steps:

a) detecting an arc being present in a plasma chamber;

b) determining an arc energy value which is a value corresponding to an energy supplied to the plasma chamber while the arc is present in the plasma chamber; and c) determining a break time from the determined arc energy value.

According to this method an individual break time is calculated or generated for each determined arc in a plasma chamber. Determining the break time may include calculating the break time from the determined arc energy value. The break time may be determined such that a quenching of the arc is ensured during the break time. After the break time has elapsed, the power can be switched on again. Switching off and turning on power to the plasma chamber is to be understood in a broad sense. Switching off or turning off the power may include at least one of switching off the power supply device, disconnecting the plasma chamber from the power supply device, or redirecting the power supplied to the plasma chamber so that the power generated by the power supply device does not reach the arc and does not sustain the arc. Switching or turning on the power may include at least one of switching on the power supply device, connecting the plasma chamber to the power supply device, or directing the power generated by the power supply device to the plasma chamber.

Detecting an arc being present in the plasma chamber may be based on measuring and analyzing a signal supplied to the plasma chamber by a power supply device. For example, a voltage or a current supplied to the plasma chamber may be the signal that is analyzed.

A point in time may be identified, when a break time starts. This may be the point in time, when an arc has been detected.

Also, the point in time may be used as the start point for calculating the energy that is supplied to the plasma chamber while the arc is present. In particular, the arc energy value may be determined based on the identified point in time and a signal supplied to the plasma chamber. In particular, the arc energy value may be determined, in particular calculated, based on the identified point in time when the arc has been detected, a point in time when the power supply device has been switched off, and a signal delivered to the plasma chamber in the time interval between the identified point in time and the point in time when the power supply device has been switched off.

The break time may be continually adjusted. Thus, a very flexible reaction on changes in the plasma process is possible. If the determination of the break time is made in the digital domain, it can be done at the same clock or cycle as the clock supplied to the power supply device.

The break time may be determined based on the determined energy value and a given coefficient. The coefficient may be predetermined. In particular, it can be supplied by an interface. For example, the determined energy value may be multiplied by a coefficient. The coefficient can be a fixed value, a regulated value by a customer, or a dynamic value calculated based on the output power, the type of a target, and/or the length of a target, etc.

Alternatively, the coefficient may be determined based on a quantity related to previous arc occurrences. For example, it can be determined based on the number of arcs having occurred in a given time interval.

An effective break time may be determined by adding an additional value to the determined break time. The additional value may be a given value, in particular, it can be given via an interface. By adding an additional value, it can be made sure that an arc really has quenched before the power supply device is switched on again.

An additional value may be added to the determined break time only if the determined break time is shorter than a reference time. Hence, a minimum break time can be achieved.

The beginning of the break time or the effective break time may be chosen. For example, the beginning of the break time may be chosen to be the time when a signal crosses a reference value which is indicative of an arc being present. Furthermore, the beginning of the break time may be set to be the time, when an arc detection signal is output from the arc detection device.

Alternatively, the beginning of the break time may be set to be the time when the power supply device to the plasma chamber is switched off. Furthermore, the beginning of the break time may be the time when the power supply to the plasma process really ends.

An arc may be detected, when there is a sudden drop in the voltage supplied to the plasma chamber. Furthermore, an arc may be detected if the voltage rises above a maximum voltage or falls below a minimum voltage. Furthermore, an arc may be detected if there is a sudden increase in current or if the current rises above a maximum current.

A data transfer arrangement may be an electrical connection, a signal path or a data transfer in a digital logic unit, for example, if the control of the power supply device and the arc treatment device are integrated in such a digital logic unit.

The control of the power supply device may be part of the arc treatment device or it can be separate from the arc treatment device.

Another aspect of the invention features a plasma process power supply including a power output connectable to deliver power to a plasma chamber and a controller coupled to the power output. The controller is configured to detect a presence of an arc in the plasma chamber; in response to detecting the presence of an arc, determine an arc energy value based on an energy supplied to the plasma chamber while the arc is present in the plasma chamber; and interrupt the power to the plasma chamber for a period of time associated with a break time determined as a function of the determined arc energy value.

The controller can include an arc treatment device and an output power controller coupled to the arc treatment device. The arc treatment device can include an arc detector operable to detect whether an arc is present in a plasma chamber, an arc energy determiner operable to determine the arc energy value, and a break time determiner operable to determine the break time based on the determined arc energy value. The output power controller can be operable to: shut off the power to the plasma chamber in response to receiving from the arc detector an arc detection signal indicating the presence of an arc, and turn on the power to the plasma chamber in response to receiving a signal indicating that the break time has elapsed.

The controller can be configured to choose a beginning of the break time from a time interval between a start of the arc and extinction of the arc, and the period of time can be no smaller than the determined break time minus a period from the chosen beginning of the break time and a time point when the output power controller receives the arc detection signal.

The plasma process power supply can further include an output signal generator operable to provide the power to the plasma chamber via the power output and controllable by the output power controller. The output signal generator can include one of an inverter and a pulse generator. The output signal generator can also include an arc extinguisher connected to the arc detector and configured to extinguish an arc.

Another aspect of the invention features a power supply device with one of the described arc treatment devices and with a power supply control.

The power supply device may be a current regulated and/or voltage regulated and/or a power regulated power supply device. For example, the power supply device may be bipolar, a DC power supply or a pulsed DC power supply with a current driven bridge inverter.

A further aspect of the invention features a plasma system with one of the described power supply devices connected to a plasma chamber and with one of the described arc treatment devices. All of the described arc treatment devices may be arranged to process one of the described methods of treating arcs.

The foregoing and other objects, features and advantages of the invention as well as the invention itself will be understood from the following illustrative description, when read together with the accompanying drawings.

DETAILED DESCRIPTION

Figure 1:
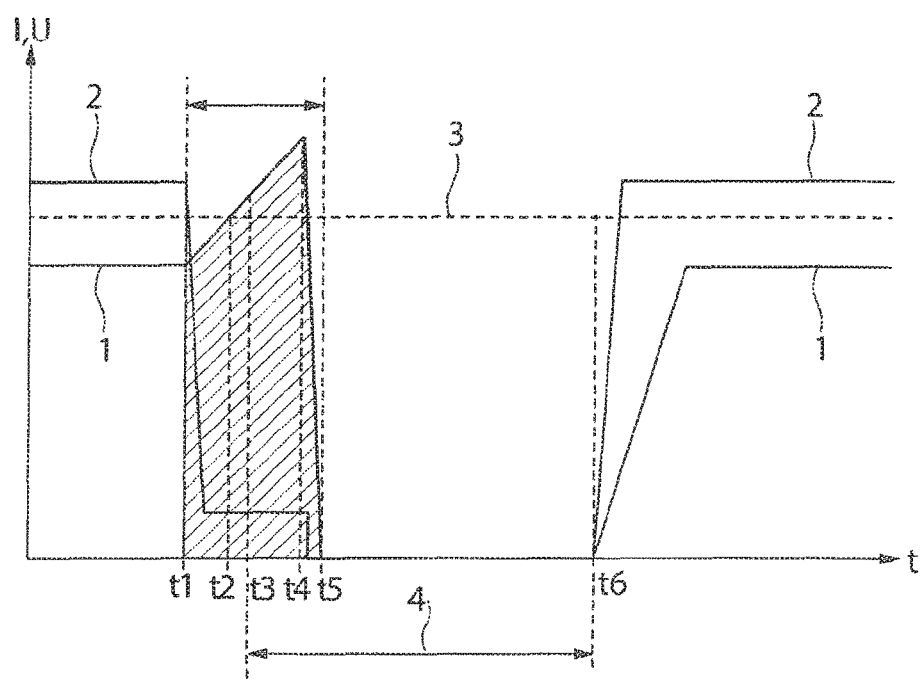
FIG. 1 is diagram explaining the determination of a break time.

FIG. 1 shows a diagram of a current I and a voltage U over time t supplied to a plasma process in a plasma chamber 30 by a plasma power supply device 10. The measured voltage signal 2 and current signal 1 are shown in the diagram. At time t1 an arc starts to occur, which can be seen by the voltage signal 2 dropping and the current signal 1 suddenly rising. At time t2, the current signal 1, which is used for detecting the occurrence of an arc, rises above an arc detection threshold 3. The time interval between time t2 and time t3 is an arc detection time. This is the time an arc detection device 21 needs to detect the arc. At time t3, there is an arc detection signal at the output of an arc detection device 21. At time t4, the power supply device 10 stops the power supply to the plasma process. The time between t3 and t4 is a hardware reaction time, i.e., the time it takes the hardware to react to the presence of an arc detection signal and switching off the power supplied to the plasma process in the plasma chamber 30.

At time t5, there is the effective (real) end of the power supply to the plasma process. This is also the time of arc extinction. In the example shown, time t3 has been chosen as the beginning of the break time 4. At time t6, the break time 4 ends and power starts to be supplied to the plasma process again. The duration of the arc is the time between times t1 and t5. Any of the points in times t1-t5 can be chosen as the beginning of the break time 4.

The break time 4 can be calculated based on the energy supplied to the plasma process between time t1 and time t5. For example, the energy value can be calculated as $$E = \sum_{t1}^{t5} Uout \square Iout \square T,$$

where T is the time of sampling, Uout and Iout are the output voltage and the output current of the plasma power supply device 10. It may also be possible to calculate the energy value between time tn and time tm, where tn may be one of the times from t1 to t3 and tm may be one of the times from t4 to t5. The break time 4 may be calculated as E*ncoef, where ncoef is a coefficient, which may be a fixed value, a value regulated by a customer, or a dynamic value calculated on the basis of power delivered to the plasma chamber, the type of a target or the length of a target.

Figure 2:
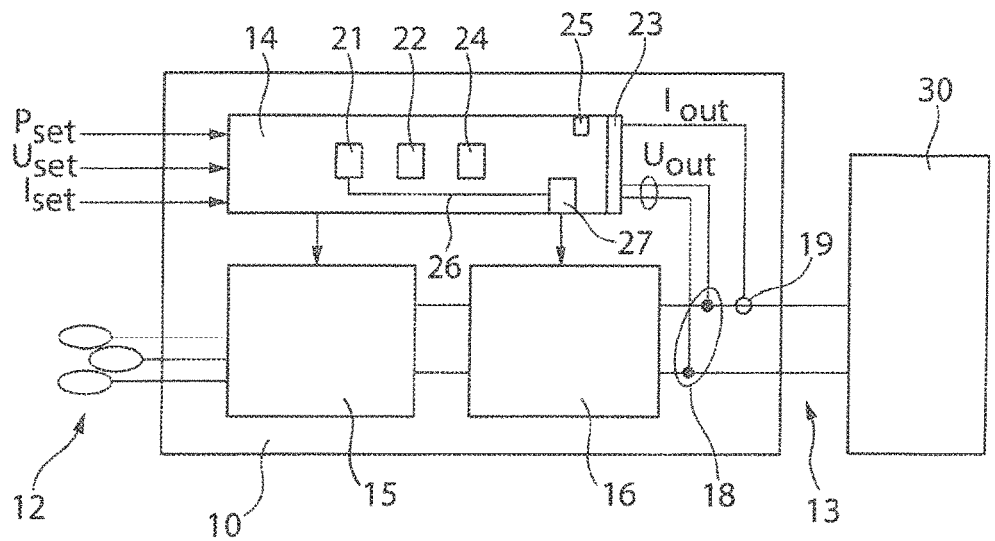
FIG. 2 is a block diagram of a plasma system with a power supply device having an arc treatment device.

FIG. 2 shows a plasma power supply device 10, which receives a supply voltage from a supply grid 12. The plasma power supply device 10 generates output signals at its output 13. Output signals can include an output current Iout and an output voltage Uout. Multiplying output voltage Uout and output current Iout results in an output power Pout, which can be also considered as an output signal.

The power supply device 10 can include a control and arc treatment device 14, which receives as an input set points Pset for the output power, Uset for the output voltage and Iset for the output current. Furthermore, the plasma power supply device 10 can include a DC (direct current) source 15. The DC source 15 is connected to an input of an output signal generator 16, e.g., a bridge inverter. The output signal generator 16 can be also controlled by the control and arc treatment device 14. Furthermore, the output signal generator 16 is connected to a plasma chamber 30, which is supplied with power by the plasma power supply device 10. In the plasma chamber 30 a plasma process takes place. Arcs may occur in the plasma process.

Signal measuring means 18, 19 at the output of output signal generator 16 deliver measuring signals to the control and arc treatment device 14. The signal measuring means 18 or 19 can include a meter measuring a physical value that can describe or indicate a status of the plasma chamber 30. In some cases, the physical value is an electrical value such as a current, a voltage, or a power and the meter can be a voltage detector, a current detector, or a power detector. In some cases, the physical value is a non-electrical value. For example, the meter can be an optical detector configured to monitor plasma in the plasma chamber.

The control and arc treatment device 14 includes an arc detection device 21 detecting an arc occurring in the plasma chamber 30. To that end, the arc detection device 21 receives signals from the measuring means 18 and/or 19. The arc detection device 21 may include a comparator configured to detect a change of the received signals, in particular, a sudden change. For example, the comparator can compare one of the measured signals with an arc detection threshold 3. The detection of an arc can be performed as described in a U.S. patent application Ser. No. 15/626,273, entitled "DETECTING AN ARC OCCURRING DURING SUPPLYING POWER TO A PLASMA PROCESS" and filed on Jun. 19, 2017, whose content is hereby incorporated by reference in its entirety.

Furthermore, the control and arc treatment device 14 can include an arc energy determination device 22 for determining the energy supplied to the plasma chamber 30, while the arc is present in the plasma chamber 30. The arc energy determination device 22 can include one or more meters for measuring a voltage V and a current A supplied to the plasma chamber 30 and a multiplier for multiplying the voltage V with the current A and a time t. The time can be a given period of time from the beginning of the arc. Thus, the arc energy value J can be determined, e.g., $J=V*A*t$. The arc energy determination device 22 can also receive measured values of the voltage V and the current A from the measuring means 18 and 19.

A break time determination device 24 is provided for determining a break time 4 from the determined arc energy value. Input 23 is provided for receiving a signal related to the plasma process. Furthermore, an input 25 may be provided to receive a coefficient $n_{coef}$, which can be used for calculating the break time 4 based on the determined arc energy value and the coefficient. The break time can represent a time between a beginning of the arc or a detection of the arc and an extinction of the arc. The break time determination device 24 can be a logic implemented by a processor configured to obtain the determined arc energy value from the arc energy determination device 22 and the coefficient that can be stored in a storage medium associated with the processor. The break time can be calculated using a function stored in the processor, or can be selected from a table in which arc energies are associated with or mapped to respective break times. The table can be stored in the storage medium associated with the processor. The processor may simply be configured to select a break time from among a table of predetermined break times, based on an arc energy.

A data transfer arrangement 26 may be provided for transferring an arc detection signal from the arc detection device 21 to a power supply control 27. The power supply control 27 can be a controller configured to control a supply voltage and/or current and/or power of a power supply or an amplifier or inverter of the power supply. Upon detection of an arc being present in the plasma chamber 30, the power supply device 10 may be switched off, so that no further power is delivered to the plasma chamber 30. The power supply device 10 may be switched on again, after the calculated break time 4 has elapsed.

The power supply control 27 may control directly the output signal generator 16.

Figure 3:
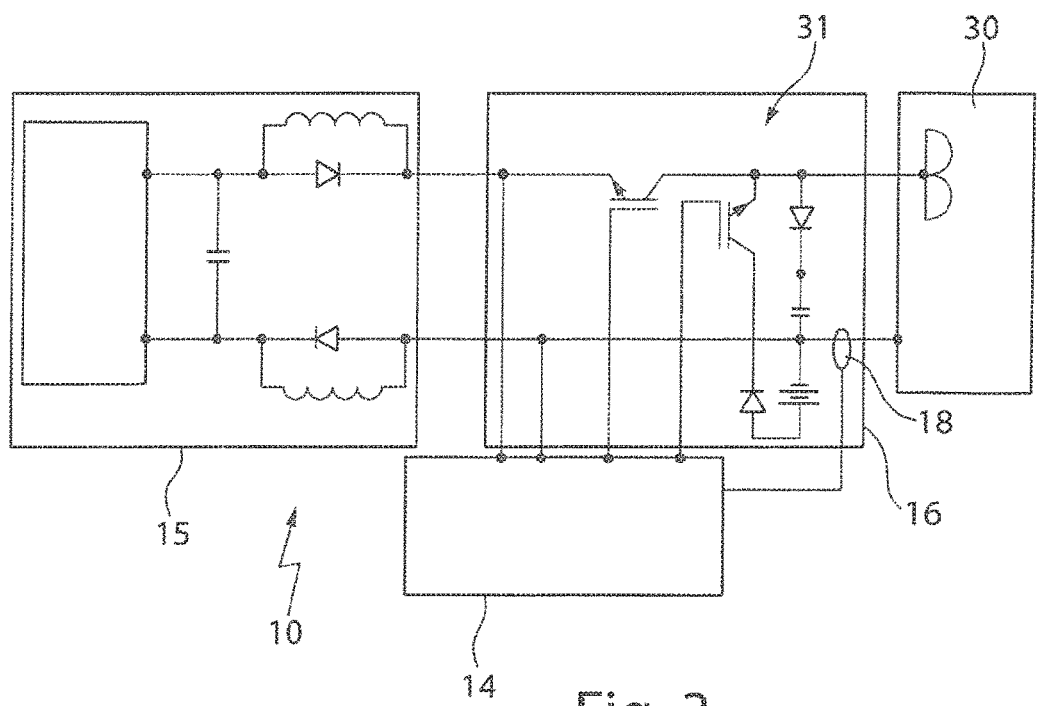
FIG. 3 is a diagram with an alternative plasma power supply device.
Figure 4:
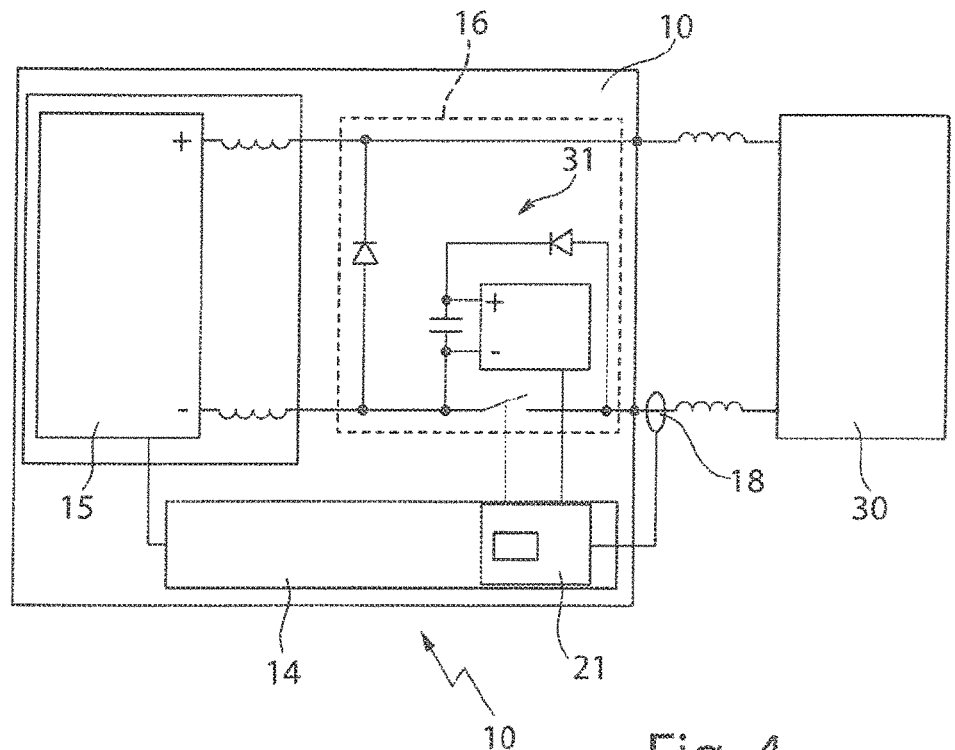
FIG. 4 is a diagram with another example of a plasma power supply device.
Figure 5:
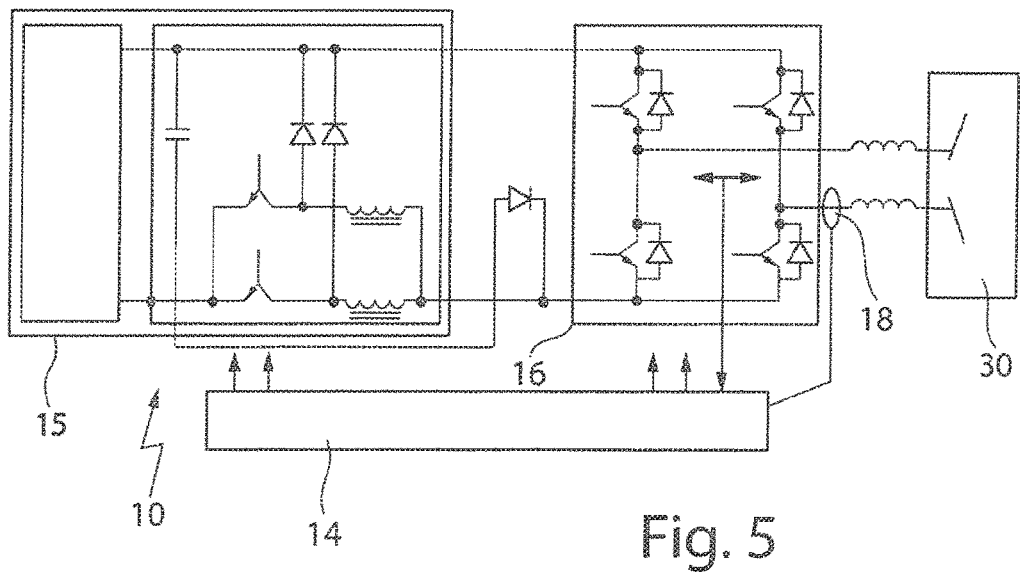
FIG. 5 is a diagram with another example of a plasma power supply device.

FIGS. 3, 4, and 5 show alternative embodiments of a plasma power supply device 10 and a plasma chamber 30, where elements corresponding to elements described above have the same reference numerals.

In FIG. 3, the output signal generator 16 is not embodied as an inverter, but as a DC-signal treatment device, which is able to generate pulses.

In FIGS. 3 and 4, the output signal generator 16 includes a unit 31, e.g., an arc extinguisher, for extinguishing an arc, which is connected to the arc detection device 21.

In the embodiment shown in FIG. 5 the output signal generator 16 is embodied as a full bridge inverter feeding the plasma process with bipolar power.

The output signal generator 16 may be an inverter such as a full bridge or a full bridge with an output transformer or an additional output resonant circuit. The plasma process in the plasma chamber 30 may in that case be a Middle-Frequency (MF) powered plasma process as shown in FIGS. 2 and 5.

The output signal generator 16 may be a pulsing unit (or a pulse generator). Additionally or alternatively, output signal generator 16 may include a unit 31 for extinguishing an arc. The plasma process in the plasma chamber 30 may in that case be a pulsed DC powered plasma process as shown in FIGS. 3 and 4.

The control and arc treatment device 14 in FIGS. 3, 4, and 5 may also include one or more of the following units or devices 21, 22, 23, 24, 25, 26, 27, although they are not shown in these figures.

A number of embodiments of the invention have been described. Nevertheless, it will be understood that various modifications may be made without departing from the spirit and scope of the invention. Accordingly, other embodiments are within the scope of the following claims.

What is claimed is:

1. An arc treatment device comprising:
   an arc detector operable to detect whether an arc is present in a plasma chamber;
   an arc energy determiner operable to determine an arc energy value based on an energy supplied to the plasma chamber while the arc is present in the plasma chamber; and
   a break time determiner operable to determine a break time based on the determined arc energy value.

2. The arc treatment device of claim 1, further comprising an input for receiving a signal associated with the plasma process,
   wherein the arc detector is operable to detect whether an arc is present in the plasma chamber based on the received signal.

3. The arc treatment device of claim 1, further comprising a data transfer arrangement operable to transfer an arc detection signal from the arc detector to a power supply controller.

4. A method of treating arcs occurring while a plasma process is being carried out in a plasma chamber, the method comprising:
   detecting an arc present in the plasma chamber;
   determining an arc energy value based on an energy supplied to the plasma chamber while the arc is present in the plasma chamber; and
   determining a break time based on the determined arc energy value.

5. The method of claim 4, wherein detecting the arc as present in the plasma chamber comprises:
   measuring and analyzing a signal supplied by a power supply device to the plasma chamber.

6. The method of claim 4, further comprising:
   identifying a point in time when the break time starts.

7. The method of claim 6, wherein determining the arc energy value comprises:
determining the arc energy value based on the identified point in time and a signal supplied to the plasma chamber.

8. The method of claim 4, wherein determining the arc energy value comprises:
determining the arc energy value to be the energy supplied to the plasma chamber while the arc is present during a time interval between a start of the arc and extinction of the arc.

9. The method of claim 4, wherein determining the arc energy value comprises:
determining the arc energy value as a portion of the energy supplied to the plasma chamber while the arc is present, during a time interval selected as one of:
an interval between time points of detection of the arc and extinction of the arc,
an interval between time points of reaction to the detection of the arc and the extinction of the arc,
an interval between a time point of the detection of the arc and a time point when an arc energy or an arc current falls under a predetermined threshold, and
an interval between a time point of reaction to the detection of the arc and a time point when the arc energy or arc current fails under the predetermined threshold.

10. The method of claim 4, further comprising:
continually adjusting the break time.

11. The method of claim 4, wherein determining the break time comprises:
determining the break time based on the determined arc energy value and a coefficient.

12. The method of claim 11, further comprising:
determining the coefficient based on a quantity associated with previous arc occurrences.

13. The method of claim 11, wherein the coefficient is one of a fixed value, a regulated value by a user, and a dynamic value calculated based on at least one of a power to the plasma process, a type of a target in the plasma process, and a length of the target.

14. The method of claim 4, further comprising:
determining an effective break time by adding a predetermined value to the determined break time.

15. The method of claim 14, further comprising:
determining that the determined break time is shorter than a reference time, and in response, determining the effective break time.

16. The method of claim 4, further comprising:
choosing a beginning of the break time from a time interval between a start of the arc and extinction of the arc.

17. A plasma process power supply comprising:
a power output connectable to deliver power to a plasma chamber; and
a controller coupled to the power output and configured to:
detect a presence of an arc in the plasma chamber;
in response to detecting the presence of an arc, determine an arc energy value based on an energy supplied to the plasma chamber while the arc is present in the plasma chamber; and
interrupt the power to the plasma chamber for a period of time associated with a break time determined as a function of the determined arc energy value.

18. The plasma process power supply of claim 17, wherein the controller comprises:
an arc treatment device including:
an arc detector operable to detect whether an arc is present in a plasma chamber;
an arc energy determiner operable to determine the arc energy value; and
a break time determiner operable to determine the break time based on the determined arc energy value; and
an output power controller coupled to the arc treatment device and operable to:
shut off the power to the plasma chamber in response to receiving from the arc detector an arc detection signal indicating the presence of an arc, and
turn on the power to the plasma chamber in response to receiving a signal indicating that the break time has elapsed.

19. The plasma process power supply of claim 18, wherein the output power controller is configured to:
choose a beginning of the break time from a time interval between a start of the arc and extinction of the arc,
wherein the period of time is no smaller than the determined break time minus a period from the chosen beginning of the break time and a time point when the output power controller receives the arc detection signal.

20. The plasma process power supply of claim 18, further comprising an output signal generator operable to provide the power to the plasma chamber via the power output and controllable by the output power controller,
wherein the output signal generator comprises one of an inverter and a pulse generator, and
wherein the output signal generator comprises an arc extinguisher connected to the arc detector and configured to extinguish an arc.

* * * * *